(12) United States Patent
Tominaga et al.

(10) Patent No.: US 12,555,722 B2
(45) Date of Patent: Feb. 17, 2026

(54) ELECTRONIC COMPONENT

(71) Applicant: Murata Manufacturing Co., Ltd., Kyoto-fu (JP)

(72) Inventors: Ryuichiro Tominaga, Nagaokakyo (JP); Takashi Komiyama, Nagaokakyo (JP); Keisuke Kunimori, Nagaokakyo (JP); Yoshimasa Yoshioka, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 201 days.

(21) Appl. No.: 18/347,253

(22) Filed: Jul. 5, 2023

(65) Prior Publication Data

US 2024/0079188 A1 Mar. 7, 2024

(30) Foreign Application Priority Data

Sep. 2, 2022 (JP) ................................. 2022-139930

(51) Int. Cl.
*H01G 17/00* (2006.01)
*H01F 27/28* (2006.01)
(Continued)

(52) U.S. Cl.
CPC ......... *H01G 17/00* (2013.01); *H01F 27/2823* (2013.01); *H01F 27/40* (2013.01);
(Continued)

(58) Field of Classification Search
CPC .......... H05K 1/09; H05K 1/115; H05K 1/162; H05K 1/165; H05K 3/4644;
(Continued)

(56) References Cited

U.S. PATENT DOCUMENTS

| | | | | |
|---|---|---|---|---|
| 5,370,766 A | * | 12/1994 | Desaigoudar | H10D 84/00 430/296 |
| 2014/0151851 A1 | * | 6/2014 | Dunn | H01G 4/228 257/532 |

FOREIGN PATENT DOCUMENTS

| | | | |
|---|---|---|---|
| JP | H09-504909 A | | 5/1997 |
| JP | H1051257 A | * | 2/1998 |

(Continued)

OTHER PUBLICATIONS

Machine translation of Arakawa et al. Japanese Patent Document H10-51257 A Aug. 1996 (Year: 1996).*

*Primary Examiner* — Kevin J Comber
(74) *Attorney, Agent, or Firm* — Studebaker Brackett PLLC

(57) ABSTRACT

An electronic component includes a capacitor element, an inductor element connected electrically to the capacitor element, and an interlayer-insulation layer between the capacitor and inductor elements. The interlayer-insulation layer has a first principal surface, a second principal surface, and a via hole through the interlayer-insulation layer between the first and second principal surfaces. The capacitor element is at a side of the second principal surface of the interlayer-insulation layer and includes a first electrode layer, a second electrode layer, and a dielectric layer interposed between the first electrode layer and the second electrode layer. The inductor element is at a side of the first principal surface of the interlayer-insulation layer and includes an inductor wire that has an inductor portion disposed on the first principal surface and also has a via portion through the via hole to connect the inductor portion to the second electrode layer.

11 Claims, 9 Drawing Sheets

(51) Int. Cl.
    *H01F 27/40*     (2006.01)
    *H05K 1/09*     (2006.01)
    *H05K 1/11*     (2006.01)

(52) U.S. Cl.
    CPC ............... *H05K 1/09* (2013.01); *H05K 1/115* (2013.01); *H05K 2201/10015* (2013.01); *H05K 2201/1003* (2013.01)

(58) Field of Classification Search
    CPC ... H05K 2201/0195; H05K 2201/1003; H05K 2201/10015; H01F 17/0006; H01F 5/04; H01F 27/40; H01F 27/2823; H01F 2017/0026; H01G 4/40; H01G 4/33; H01G 17/00
    USPC .................................. 361/270; 257/531, 532
    See application file for complete search history.

(56) References Cited

FOREIGN PATENT DOCUMENTS

| | | |
|---|---|---|
| JP | 2018-198277 A | 12/2018 |
| JP | 2021-166257 A | 10/2021 |

* cited by examiner

ELECTRONIC COMPONENT

CROSS-REFERENCE TO RELATED APPLICATION

This application claims benefit of priority to Japanese Patent Application No. 2022-139930, filed Sep. 2, 2022, the entire content of which is incorporated herein by reference.

BACKGROUND

Technical Field

The present disclosure relates to an electronic component.

Background Art

A known electronic component is described in Japanese Unexamined Patent Application Publication No. 10-51257. The electronic component includes an inductor wire, a capacitor electrode connected electrically to the inductor wire, and an insulating layer interposed between the inductor wire and the capacitor electrode. The inductor wire and the capacitor electrode are connected to each other by a via portion formed through a via hole in the insulating layer.

SUMMARY

In the above known electronic component, the adhesion between the inductor wire and the capacitor electrode is not always sufficient, and the inductor wire and the capacitor electrode may be detached from each other. In addition, the adhesion between the inductor wire and the insulating layer is not always sufficient, and the inductor wire and the insulating layer may be detached from each other.

Accordingly, the present disclosure provides an electronic component that can reduce the likelihood of detachment between the inductor element and the capacitor element and also between the inductor element and the insulating layer.

According to an aspect of the present disclosure, an electronic component includes a capacitor element, an inductor element connected electrically to the capacitor element, and an interlayer-insulation layer interposed between the capacitor element and the inductor element. The interlayer-insulation layer has a first principal surface, a second principal surface, and a via hole formed through the interlayer-insulation layer between the first principal surface and the second principal surface. The capacitor element is disposed at a side of the second principal surface of the interlayer-insulation layer and includes a first electrode layer, a second electrode layer, and a dielectric layer interposed between the first electrode layer and the second electrode layer. The inductor element is disposed at a side of the first principal surface of the interlayer-insulation layer and includes an inductor wire that has an inductor portion disposed on the first principal surface and also has a via portion formed through the via hole so as to connect the inductor portion to the second electrode layer. The inductor wire further includes a contact layer, a conducting layer formed so as to be in contact with the contact layer, and a metal layer formed so as to be in contact with the conducting layer. The contact layer is in continuous contact with the first principal surface, an inside surface of the via hole, and the second electrode layer.

According to the above configuration, the contact layer is in continuous contact with the first principal surface of the interlayer-insulation layer, the inside surface of the via hole of the interlayer-insulation layer, and the second electrode layer, which can improve the adhesion between the inductor wire and the second electrode layer and also between the inductor wire and the interlayer-insulation layer. Accordingly, the likelihood of detachment between the inductor element and the capacitor element and also between the inductor element and the interlayer-insulation layer can be reduced.

According to an aspect of the present disclosure, the electronic component can reduce the likelihood of detachment between the inductor element and the capacitor element and also between the inductor element and the insulating layer.

DETAILED DESCRIPTION

An electronic component according to an embodiment of the present disclosure will be described with reference to the drawings. Note that the drawings include schematic illustrations and do not necessarily reflect actual dimensions nor dimensional relationships.

First Embodiment

Overall Structure

Figure 1:
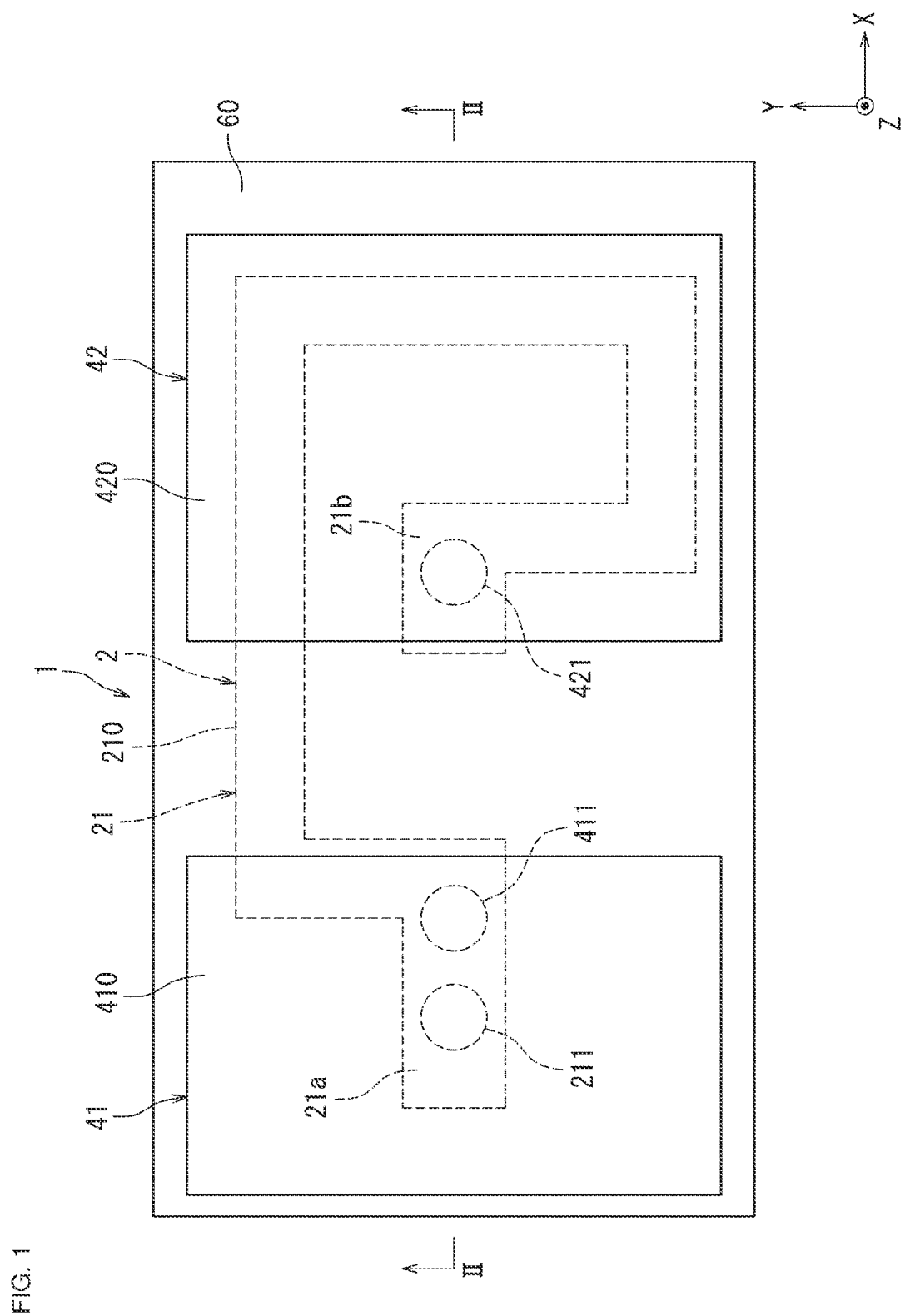
FIG. 1 is a plan view illustrating an electronic component according to a first embodiment.
Figure 2:
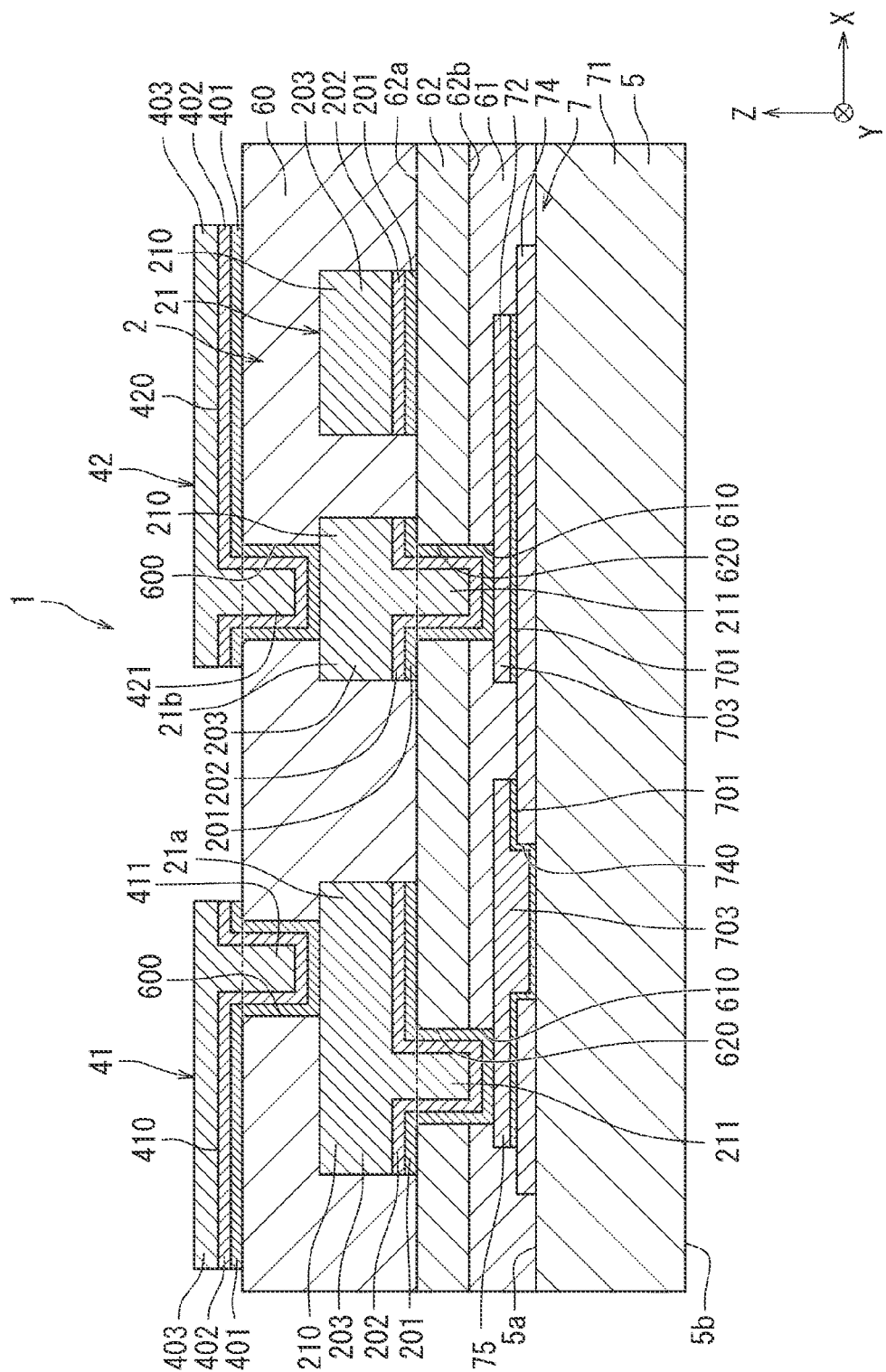
FIG. 2 is a cross-sectional view taken along line II-II in FIG. 1.
Figure 3:
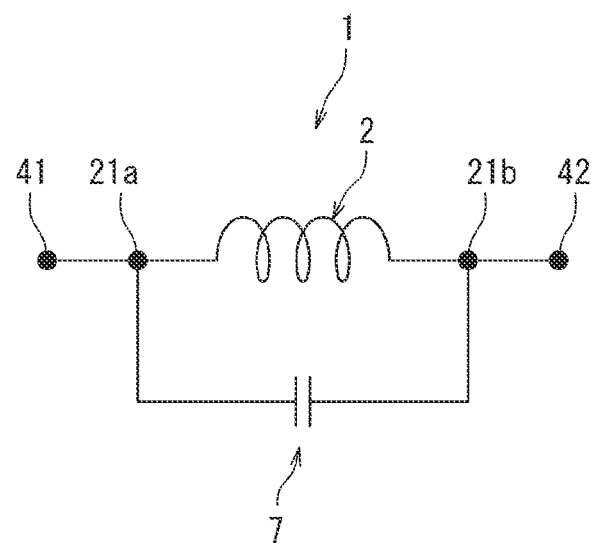
FIG. 3 is an equivalent circuit diagram of the electronic component of the first embodiment.

FIG. 1 is a plan view illustrating an electronic component according to a first embodiment. FIG. 2 is a cross-sectional view taken along line II-II in FIG. 1. FIG. 3 is an equivalent circuit diagram of the electronic component of the first embodiment. As illustrated in FIGS. 1, 2, and 3, an electronic component 1 includes a capacitor element 7, an inductor element 2, and an interlayer-insulation layer 62.

The interlayer-insulation layer 62 is interposed between the capacitor element 7 and the inductor element 2. The interlayer-insulation layer 62 has a first principal surface 62a and a second principal surface 62b that face oppositely to each other. The interlayer-insulation layer 62 has via holes 620 formed between the first principal surface 62a and the second principal surface 62b.

The capacitor element 7 is disposed at the side of the second principal surface 62b of the interlayer-insulation layer 62. The capacitor element 7 includes a first electrode layer 71, a second electrode layer 72, and a dielectric layer 74. The dielectric layer 74 is interposed between the first electrode layer 71 and the second electrode layer 72.

The inductor element 2 is disposed at the side of the first principal surface 62a of the interlayer-insulation layer 62. The inductor element 2 includes an insulator 60 and an inductor wire 21 disposed inside the insulator 60. The inductor wire 21 further includes an inductor portion 210 and via portions 211. The inductor portion 210 is disposed on the first principal surface 62a of the interlayer-insulation layer 62, and one of the via portions 211 extends through a via hole 620 of the interlayer-insulation layer 62 so as to connect the inductor portion 210 to the second electrode layer 72. The interface between the inductor portion 210 and the via portion 211 is positioned on the same plane on which the first principal surface 62a of the interlayer-insulation layer 62 extends. The interface is indicated by the dash-dot-dot line in FIG. 2. The inductor portion 210 and the via portion 211, however, are formed integrally, which makes it difficult to distinguish the interface. The inductor portion 210 and the via portion 211 can be formed such that the interface is distinguishable. The inductor wire 21 includes a contact layer 201, a conducting layer 202 formed so as to be in contact with the contact layer 201, and a metal layer 203 formed so as to be in contact with the conducting layer 202. The contact layer 201 is made of a metal having adhesiveness and electroconductivity. The contact layer 201 improves adhesion between members to be in contact with the contact layer 201. The conducting layer 202 is made of a metal having electroconductivity. The conducting layer 202 can receive electric charges supplied from outside to serve, for example, as a seed layer for plating. The metal layer 203 is made of a metal having electroconductivity. The metal layer 203 is, for example, a plating layer.

The contact layer 201 is formed continuously so as to extend on the first principal surface 62a of the interlayer-insulation layer 62, the inside surface of the via hole 620 of the interlayer-insulation layer 62, and the second electrode layer 72. The contact layer 201 is in continuous contact with the first principal surface 62a of the interlayer-insulation layer 62, the inside surface of the via hole 620 of the interlayer-insulation layer 62, and the second electrode layer 72. In other words, the portions of the contact layer 201 in direct contact respectively with the first principal surface 62a, the inside surface of the via hole 620, and the second electrode layer 72 are formed without interruption so as to maintain electrical continuity.

According to this configuration, the contact layer 201 is in continuous contact with the first principal surface 62a of the interlayer-insulation layer 62, the inside surface of the via hole 620 of the interlayer-insulation layer 62, and the second electrode layer 72, which improves the adhesion between the inductor wire 21 and the second electrode layer 72 and also between the inductor wire 21 and the interlayer-insulation layer 62. This can reduce the likelihood of detachment between the inductor element 2 and the capacitor element 7 and also between the inductor element 2 and the interlayer-insulation layer 62.

Here, assume that the contact layer is not provided for the inductor wire. Even in this case, the adhesion between the inductor wire and the interlayer-insulation layer can be increased, for example, by coarsening the first principal surface of the interlayer-insulation layer using coarsening treatment and thereby increasing the contact area between the first principal surface and the inductor wire. In this case, however, the coarsened first principal surface of the interlayer-insulation layer inevitably coarsens the contact surface of the inductor wire in contact with the first principal surface, which may deteriorate the high-frequency characteristics of the inductor wire. According to the present embodiment, however, the adhesion between the inductor wire and the interlayer-insulation layer can be improved without coarsening the contact surface therebetween.

Preferred Configuration

Electronic Component 1

The electronic component 1 is mounted in an electronic device, such as a personal computer, a DVD player, a digital camera, a TV set, a mobile phone, or an in-car electronic device. The electronic component 1 includes the capacitor element 7, a protective layer 61, the interlayer-insulation layer 62, the inductor element 2, a first outer terminal 41, and a second outer terminal 42.

In the drawings, the thickness direction of the electronic component 1 is referred to as the "Z direction", in which the positive Z direction is directed upward and the negative Z direction is directed downward. When the electronic component 1 is placed on a plane orthogonal to the Z direction of the electronic component 1, the X direction is defined as the longitudinal direction of the electronic component 1, in other words, the length direction of the electronic component 1 in which the first outer terminal 41 and the second outer terminal 42 are arranged side by side. The Y direction is defined as the width direction of the electronic component 1, which is the direction orthogonal to the length direction.

The inductor wire 21 of the inductor element 2 has a first end 21a that is connected to the first outer terminal 41. The inductor wire 21 has a second end 21b that is connected to the second outer terminal 42. The first end 21a of the inductor wire 21 is connected to a first end of the capacitor element 7. The second end 21b of the inductor wire 21 is connected to a second end of the capacitor element 7. Accordingly, the inductor element 2 and the capacitor element 7 are connected in parallel to each other and thereby form an LC resonance circuit.

Capacitor Element 7

The capacitor element 7 includes the first electrode layer 71, the second electrode layer 72, the dielectric layer 74, and a connection conductor layer 75.

The first electrode layer 71 extends parallel to the second principal surface 62b of the interlayer-insulation layer 62. The first electrode layer 71 is formed on a substrate 5. The substrate 5 has a first principal surface 5a and a second principal surface 5b that face oppositely to each other. For example, the substrate 5 is a semiconductor substrate that contains silicon. The first electrode layer 71 is a highly conductive doped region formed by doping impurities into the substrate 5. In the present embodiment, the substrate 5 is formed entirely of the doped region. The doped region, however, may be formed in part of the substrate 5. In this case, the doped region is not formed in a portion of the substrate 5 that is exposed to the outside of the electronic component 1, thereby maintaining the insulation of the electronic component 1.

When the first electrode layer 71 is formed as the doped region by introducing impurities to the substrate 5, the impurities of a III- or V-group element is added, for example, to a silicon substrate 5 at a concentration of $1 \times 10^{16}/cm^3$ or more, which enables the doped region of the substrate 5 to decrease in electric resistivity and thereby serve as a conductor. It is preferable that the electric resistivity of the doped region of the substrate 5 be 1 Ω·cm or less. Accordingly, the doped region of the substrate 5 having a low electric resistivity can be used as a ground or an electrode layer for a capacitor.

Note that the first electrode layer 71 can be formed as a metal film separated from the substrate 5. For example, the first electrode layer 71 can be formed on the substrate 5 as a separate thin film using chemical vapor deposition (CVD), atomic layer deposition (ALD), or sputtering. In this case, the dielectric layer 74 is formed on the first electrode layer 71 that has been made as the thin film, and the second electrode layer 72 is formed on the dielectric layer 74.

The second electrode layer 72 extends parallel to the second principal surface 62b of the interlayer-insulation layer 62. The second electrode layer 72 faces oppositely to the first electrode layer 71 in the direction orthogonal to the second principal surface 62b. The second electrode layer 72 is formed so as to extend along the first electrode layer 71. The second electrode layer 72 is a thin metal film. For example, the second electrode layer 72 can be formed using chemical vapor deposition, atomic layer deposition, or sputtering.

The second electrode layer 72 includes a contact layer 701 and a metal layer 703 formed so as to be in contact with the contact layer 701. The contact layer 701 is in contact with the upper surface of the dielectric layer 74. The contact layer 701 is made of a metal having adhesiveness and electroconductivity. The contact layer 701 is preferably a titanium layer (Ti layer), which can improve the adhesion with the dielectric layer 74. The metal layer 703, which is made of an electroconductive metal, is preferably an aluminum layer (Al layer). The contact layer 701 is preferably formed such that a ratio of the thickness of the metal layer 703 to the thickness of the contact layer 701 is 7 to 15 in view of providing a sufficient adhesion and controlling the thickness of the second electrode layer 72. For example, the thickness of the contact layer 701 is 0.1 μm, and the thickness of the metal layer 703 is 1 μm.

The dielectric layer 74 is interposed between the first electrode layer 71 and the second electrode layer 72. The dielectric layer 74 is formed so as to extend along the first electrode layer 71. The dielectric layer 74 is a thin film of a dielectric material. For example, the dielectric layer 74 is formed using chemical vapor deposition or atomic layer deposition. For example, the dielectric layer 74 is made of $SiO_2$ formed using thermal oxidation. For example, the thickness of the dielectric layer 74 is 0.9 μm.

The connection conductor layer 75 is formed on the upper surface of the dielectric layer 74 as the same layer of the second electrode layer 72. Part of the connection conductor layer 75 is formed through a via hole 740 of the dielectric layer 74 and connected to the first electrode layer 71. The connection conductor layer 75 includes the contact layer 701 and the metal layer 703 formed so as to be in contact with the contact layer 701 as is the second electrode layer 72. The contact layer 701 is in contact with the upper surface of the dielectric layer 74, the inside surface of the via hole 740 of the dielectric layer 74, and the first electrode layer 71.

The first electrode layer 71 is connected to the connection conductor layer 75, and the connection conductor layer 75 is connected to the first end 21a of the inductor wire 21. Accordingly, the first electrode layer 71 is electrically connected to the first end 21a of the inductor wire 21 and also electrically connected to the first outer terminal 41.

The second electrode layer 72 is connected to the second end 21b of the inductor wire 21. Accordingly, the second electrode layer 72 is electrically connected to the second end 21b of the inductor wire 21 and also electrically connected to the second outer terminal 42. When a voltage is applied between the first outer terminal 41 and the second outer terminal 42, the first electrode layer 71 and the second electrode layer 72 generate capacitance.

Note that the first electrode layer 71 can be directly connected to the first end 21a of the inductor wire 21 without using the connection conductor layer 75. In this case, the first end 21a of the inductor wire 21 is directly connected to the first electrode layer 71 through the via hole 740 of the dielectric layer 74.

Protective Layer 61

The protective layer 61 is formed on the first electrode layer 71 (on the first principal surface 5a of the substrate 5) so as to cover the second electrode layer 72, the dielectric layer 74, and the connection conductor layer 75. The protective layer 61 is made as a single layer of SiN, $SiO_2$, as BPSG or of laminated multiple layers of these. The protective layer 61 protects the dielectric layer 74 from moisture.

Interlayer-Insulation Layer 62

The interlayer-insulation layer 62 is formed on the protective layer 61. For example, the interlayer-insulation layer 62 is made of an organic insulating material, such as an epoxy-based, phenol-based, liquid polymer-based, polyimide-based, or acrylic-based material, or a mixture thereof. For example, the thickness of the interlayer-insulation layer 62 is preferably 10 to 50 μm in order to control the thickness of the electronic component 1 while ensuring the insulation between the inductor wire 21 and the second electrode layer 72 of the capacitor element 7. Note that the protective layer 61 can be omitted. In this case, the interlayer-insulation layer 62 is formed on the first electrode layer 71 (on the first principal surface 5a of the substrate 5) so as to cover the second electrode layer 72, the dielectric layer 74, and the connection conductor layer 75.

Inductor Element 2

The inductor element 2 includes the insulator 60 and the inductor wire 21 disposed inside the insulator 60.

For example, the insulator 60 is made of an organic insulating material, such as an epoxy-based, phenol-based, liquid polymer-based, polyimide-based, or acrylic-based material, or a mixture thereof. Note that the insulator 60 can be made as a magnetic layer that contains a magnetic powder and a resin. For example, the resin is made of an organic insulating material, such as an epoxy-based, phenol-based, liquid polymer-based, polyimide-based, or acrylic-based material, or a mixture thereof. For example, the magnetic powder is made of an FeSi-based alloy, such as FeSiCr, an FeCo-based alloy, or an Fe-based alloy, such as NiFe, or an amorphous alloy thereof. Compared with a magnetic layer made of ferrite, the magnetic powder improves the DC superposition characteristics and reduces the iron loss in high frequencies due to resin insulation between magnetic particles. The magnetic layer can be ferrite or a sintered compact of the magnetic powder. In other words, the magnetic layer can be made of a material that does not contain an organic resin.

The inductor wire 21 extends spirally on the first principal surface 62a of the interlayer-insulation layer 62. The number of turns of the inductor wire 21 preferably exceeds one, which can improve the inductance of the inductor element 2. For example, when the inductor wire 21 is viewed in the Z direction, the inductor wire 21 is wound spirally clockwise from the first end 21a, which is the outer end, toward the second end 21b, which is the inner end.

The inductor wire 21 includes the inductor portion 210 and the via portions 211. The inductor portion 210 is a portion wound spirally on the first principal surface 62a. Each via portion 211 is a portion that is formed through the via hole 620 of the interlayer-insulation layer 62 and further through the via hole 610 of the protective layer 61. More specifically, the via portion 211 of the inductor wire 21 at the first end 21a is connected to the connection conductor layer 75, and the via portion 211 of the inductor wire 21 at the second end 21b is connected to the second electrode layer 72.

The inductor wire 21 includes the contact layer 201, the conducting layer 202 formed so as to be in contact with the contact layer 201, and the metal layer 203 formed so as to be in contact with the conducting layer 202. The contact layer 201 is formed continuously so as to extend on the first principal surface 62a of the interlayer-insulation layer 62, the inside surface of the via hole 620 of the interlayer-insulation layer 62, and the second electrode layer 72. The contact layer 201 is in continuous contact with the first principal surface 62a of the interlayer-insulation layer 62, the inside surface of the via hole 620 of the interlayer-insulation layer 62, and the second electrode layer 72. More specifically, the inductor portion 210 includes the contact layer 201, the conducting layer 202, and the metal layer 203, and the via portion 211 also includes the contact layer 201, the conducting layer 202, and the metal layer 203.

The contact layer 201 is preferably a titanium layer (Ti layer). For example, the thickness of the contact layer 201 is 0.35 µm.

For example, the conducting layer 202 is made of Au, Pt, Pd, Ag, Cu, Al, Co, Cr, Zn, Ni, Ti, W, Fe, Sn, In, or a compound thereof. The conducting layer 202 is preferably a seed layer. For example, the thickness of the conducting layer 202 is desirably 2 µm or less. The thickness, however, is not specifically limited insofar as the conducting layer 202 can receive electric charges and serve as the seed layer in electrolytic plating. The conducting layer 202 is formed on the contact layer 201, for example, using sputtering.

For example, the metal layer 203 is made of Au, Pt, Pd, Ag, Cu, Al, Co, Cr, Zn, Ni, Ti, W, Fe, Sn, In, or a compound thereof. For example, the thickness of the metal layer 203 is 30 µm. The metal layer 203 is preferably a copper layer (Cu layer). The metal layer 203 is preferably a plating layer. The metal layer 203 is formed on the conducting layer 202 by electrolytic plating while electric charges are supplied to the conducting layer 202.

First Outer Terminal 41 and Second Outer Terminal 42

The first outer terminal 41 is disposed on the upper surface of the insulator 60. The first outer terminal 41 includes a main portion 410 and a via portion 411. The main portion 410 is a tabular portion disposed on the upper surface of the insulator 60. The via portion 411 is formed through a via hole 600 of the insulator 60 and connected to the first end 21a of the inductor wire 21. The interface between the main portion 410 and the via portion 411 is positioned on the same plane on which the upper surface of the insulator 60 extends. The interface is indicated by the dash-dot-dot line in FIG. 2. The main portion 410 and the via portion 411, however, are formed integrally, which makes it difficult to distinguish the interface. The main portion 410 and the via portion 411 can be formed such that the interface is distinguishable.

The first outer terminal 41 includes a contact layer 401, a conducting layer 402 formed so as to be in contact with the contact layer 401, and a metal layer 403 formed so as to be in contact with the conducting layer 402. The contact layer 401 is formed continuously so as to extend on the upper surface of the insulator 60, the inside surface of the via hole 600 of the insulator 60, and the metal layer 203 of the inductor wire 21. The contact layer 401 is in continuous contact with the upper surface of the insulator 60, the inside surface of the via hole 600 of the insulator 60, and the metal layer 203 of the inductor wire 21. More specifically, the main portion 410 includes the contact layer 401, the conducting layer 402, and the metal layer 403, and the via portion 411 also includes the contact layer 401, the conducting layer 402, and the metal layer 403. The materials of the contact layer 401, the conducting layer 402, and the metal layer 403 of the first outer terminal 41 are the same as those of the contact layer 201, the conducting layer 202, and the metal layer 203 of the inductor wire 21, respectively.

The second outer terminal 42 is disposed on the upper surface of the insulator 60. The second outer terminal 42 includes a main portion 420 and a via portion 421 as is the case for the first outer terminal 41. The main portion 420 is a tabular portion disposed on the upper surface of the insulator 60. The via portion 421 is formed through another via hole 600 of the insulator 60 and connected to the second end 21b of the inductor wire 21. The interface between the main portion 420 and the via portion 421 is positioned on the same plane on which the upper surface of the insulator 60 extends. The interface is indicated by the dash-dot-dot line in FIG. 2.

The second outer terminal 42 also includes the contact layer 401, the conducting layer 402 formed so as to be in contact with the contact layer 401, and the metal layer 403 formed so as to be in contact with the conducting layer 402. The contact layer 401 is formed continuously so as to extend on the upper surface of the insulator 60, the inside surface of the via hole 600 of the insulator 60, and the metal layer 203 of the inductor wire 21. The contact layer 401 is in continuous contact with the upper surface of the insulator 60, the inside surface of the via hole 600 of the insulator 60, and the metal layer 203 of the inductor wire 21. More specifically, the main portion 420 includes the contact layer 401, the conducting layer 402, and the metal layer 403, and the via portion 421 also includes the contact layer 401, the conducting layer 402, and the metal layer 403. The materials of the contact layer 401, the conducting layer 402, and the metal layer 403 of the second outer terminal 42 are the same as those of the contact layer 401, the conducting layer 402, and the metal layer 403 of the first outer terminal 41, respectively.

Contact of Inductor Wire 21 with Interlayer-Insulation Layer 62 and Second Electrode Layer 72

The contact layer 201 of the inductor wire 21 is in continuous contact with the first principal surface 62a of the interlayer-insulation layer 62, the inside surface of the via hole 620 of the interlayer-insulation layer 62, and the second electrode layer 72. This can improve the adhesion between the inductor wire 21 and the second electrode layer 72 and also between the inductor wire 21 and the interlayer-insulation layer 62. Accordingly, this can reduce the likelihood of detachment between the inductor element 2 and the capacitor element 7 and also between the inductor element 2 and the interlayer-insulation layer 62.

The contact layer 201 of the inductor wire 21 is preferably the Ti layer. The second electrode layer 72 includes an Al layer in contact with the contact layer 201. In other words, the metal layer 703 of the second electrode layer 72 is made as the Al layer.

Accordingly, the second electrode layer 72 that contains the Al layer can be formed accurately, which can reduce the variation in the characteristics of the second electrode layer 72. In addition, the contact layer 201 is made as the Ti layer. Accordingly, the Ti layer can improve the adhesion of the contact layer 201 to the Al layer of the second electrode layer 72 as well as to the conducting layer 202 and to the interlayer-insulation layer 62.

Moreover, due to the contact layer 201 being made as the Ti layer, the growth of "hillocks" on the Al layer of the second electrode layer 72 can be suppressed. The term "hillocks" refers to defective hemispherical bumps grown on the surface of a metal layer. The hillocks tend to be grown on the Al layer. However, forming the Ti layer on the Al layer can suppress the growth of the hillocks.

The metal layer 203 is preferably a copper layer (Cu layer). This improves the electric conductivity of the metal layer 203, thereby increasing the Q-value. If the Cu layer (metal layer 203) and the Al layer (second electrode layer 72) are in direct contact with each other, the two layers tend to be detached from each other. However, the formation of the Ti layer (contact layer 201) between the Cu layer and the Al layer can reduce the likelihood of detachment between the Cu layer and the Al layer.

The ratio of the thickness of the metal layer 203 of the inductor portion 210 to the thickness of the second electrode layer 72 is 15 or more and 70 or less (i.e., from 15 to 70). The term "thickness" here is defined as the dimension in the direction normal to the first principal surface 62a of the interlayer-insulation layer 62 (in other words, in the Z direction). The thickness can be measured by obtaining an SEM (scanning electron microscope) image of a cross section of the electronic component 1 taken in the Z direction and by measuring thicknesses at five points using the SEM image. The thickness result is obtained by averaging five thicknesses. The thickness of the metal layer 203 is preferably in the range of 30±5 µm, and the thickness of the second electrode layer 72 is preferably in the range of 1±0.5 µm.

According to this configuration, the above ratio is 15 or more. Accordingly, the precision in patterning the second electrode layer 72 can be improved by reducing the thickness of the second electrode layer 72, thereby reducing the variation of the capacitance. Moreover, the direct current resistance of the metal layer 203 of the inductor portion 210 can be reduced by increasing the thickness of the metal layer 203 of the inductor portion 210, thereby increasing the Q-value. On the contrary, if the thickness of the second electrode layer 72 is too large, the precision in patterning the second electrode layer 72 is deteriorated, thereby increasing the variation of the capacitance. If the thickness of the metal layer 203 of the inductor portion 210 is too small, the direct current resistance of the metal layer 203 increases, thereby decreasing the Q-value.

According to the above configuration, the ratio is 70 or less. Accordingly, the coverage over the dielectric layer 74 can be increased by increasing the thickness of the second electrode layer 72, thereby improving the characteristics of the capacitor. Moreover, the variation of the thickness of, for example, the Cu plating can be reduced by decreasing the thickness of the metal layer 203 of the inductor portion 210, thereby reducing the variation in the characteristics of the inductor. On the contrary, if the thickness of the second electrode layer 72 is too small, the coverage of the second electrode layer 72 over the dielectric layer 74 decreases, thereby deteriorating the characteristics of the capacitor. If the thickness of the metal layer 203 of the inductor portion 210 is too large, the variation of the thickness of, for example, the Cu plated layer increases, thereby increasing the variation in the characteristics of the inductor.

The contact between the inductor wire 21 and the connection conductor layer 75 is similar to the contact between the inductor wire 21 and the second electrode layer 72. In other words, the contact layer 201 of the inductor wire 21 is in continuous contact with the first principal surface 62a of the interlayer-insulation layer 62, the inside surface of the via hole 620 of the interlayer-insulation layer 62, and the connection conductor layer 75 at the first end 21a of the inductor wire 21. This can improve the adhesion between the inductor wire 21 and the connection conductor layer 75.

Manufacturing Method

Next, a method of manufacturing the electronic component 1 will be described.

Figure 4A:
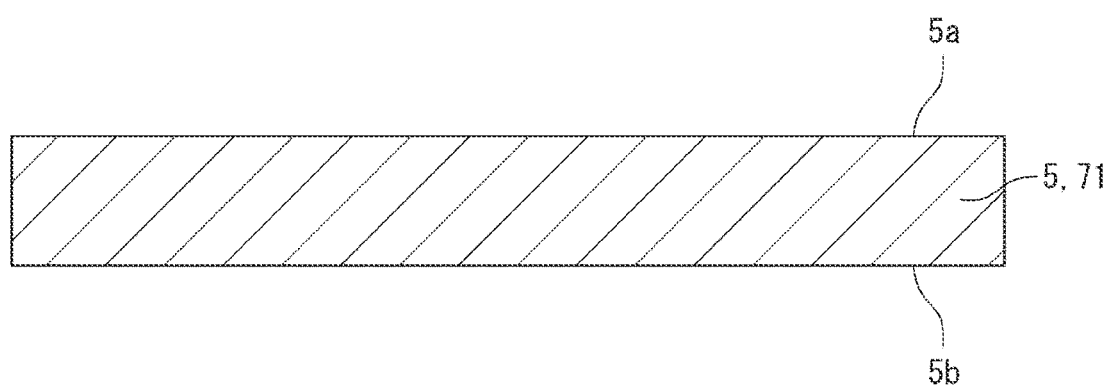
FIG. 4A is a cross-sectional view for explaining a method of manufacturing an electronic component.

The substrate 5 is prepared as illustrated in FIG. 4A. The substrate 5 contains silicon and has the first principal surface 5a and the second principal surface 5b that face oppositely to each other. Ions are injected into the substrate 5 to obtain a substrate with a high electroconductivity. This enables the substrate 5 to function as the first electrode layer 71 of the capacitor element 7.

Figure 4B:
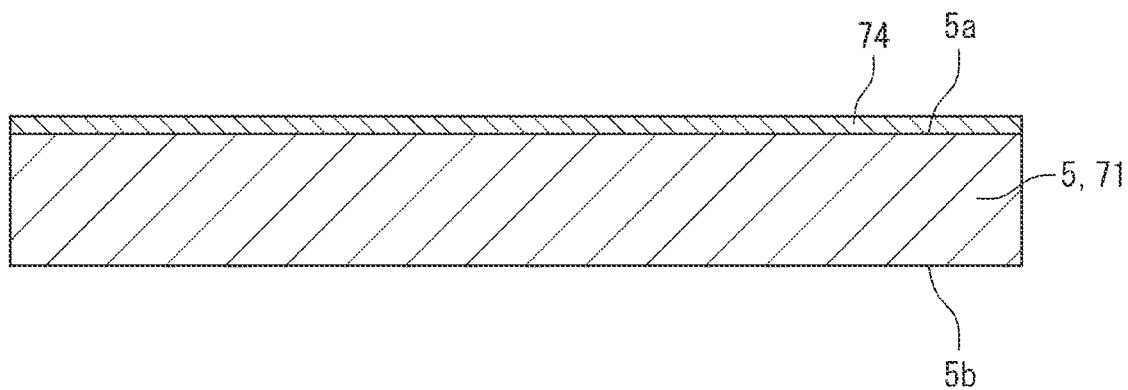
FIG. 4B is another cross-sectional view for explaining the method of manufacturing the electronic component.
Figure 4C:
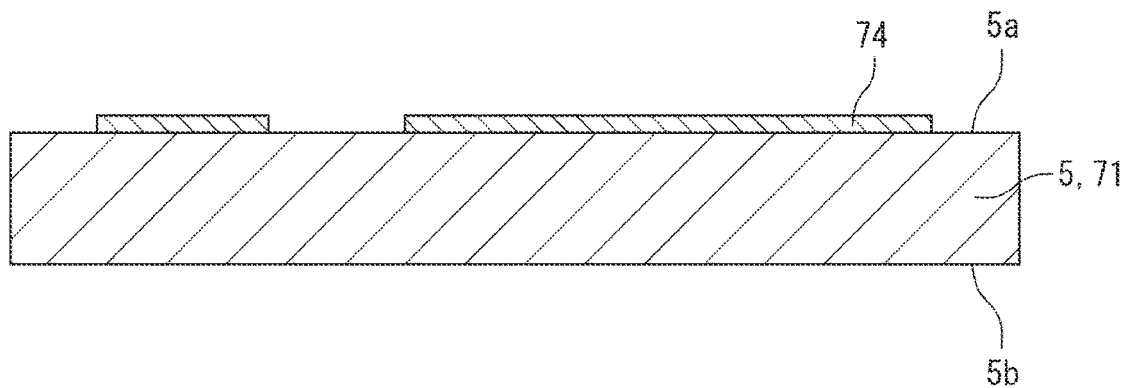
FIG. 4C is another cross-sectional view for explaining the method of manufacturing the electronic component.

As illustrated in FIG. 4B, the dielectric layer 74 is formed on the first principal surface 5a of the substrate 5. As illustrated in FIG. 4C, the dielectric layer 74 is etched with a predetermined pattern using photolithography.

Figure 4D:
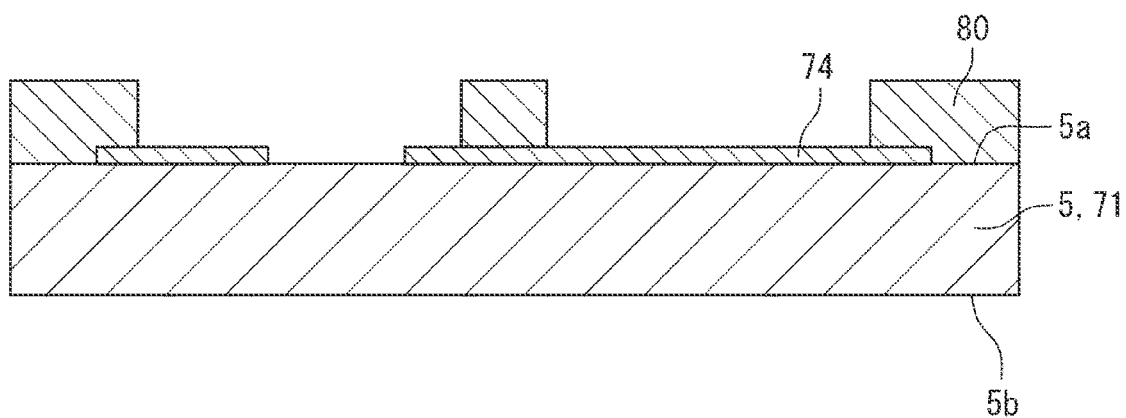
FIG. 4D is another cross-sectional view for explaining the method of manufacturing the electronic component.
Figure 4E:
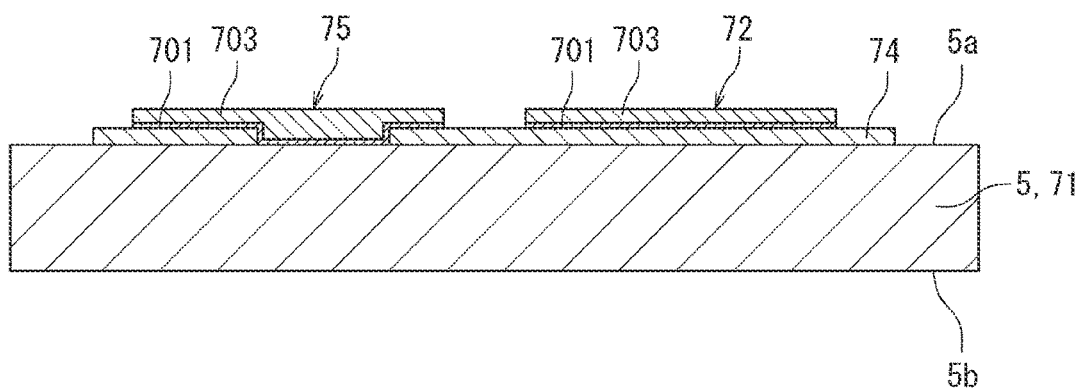
FIG. 4E is another cross-sectional view for explaining the method of manufacturing the electronic component.

As illustrated in FIG. 4D, a resist 80 is applied, using a pattern, to the first principal surface 5a of the substrate 5 and to the dielectric layer 74. As illustrated in FIG. 4E, the contact layer 701 and the metal layer 703 are formed on the dielectric layer 74 by vapor deposition to form the second electrode layer 72 and the connection conductor layer 75. The resist 80 is subsequently removed.

Figure 4F:
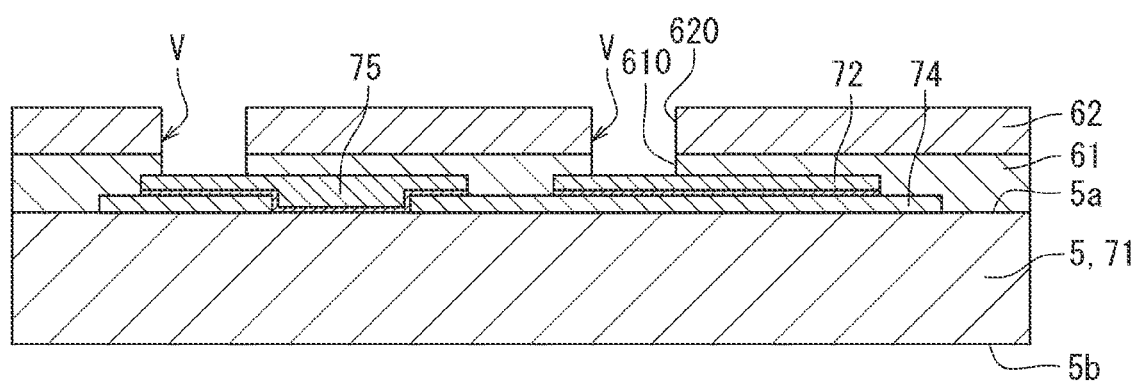
FIG. 4F is another cross-sectional view for explaining the method of manufacturing the electronic component.

As illustrated in FIG. 4F, the protective layer 61 is formed on the first principal surface 5a of the substrate 5 so as to cover the second electrode layer 72, the dielectric layer 74, and the connection conductor layer 75. Subsequently, the interlayer-insulation layer 62 is formed on the protective layer 61. Via holes V (via holes 610 and via holes 620) are formed using photolithography through the protective layer 61 and through the interlayer-insulation layer 62 so as to expose the second electrode layer 72 and the connection conductor layer 75, respectively.

Figure 4G:
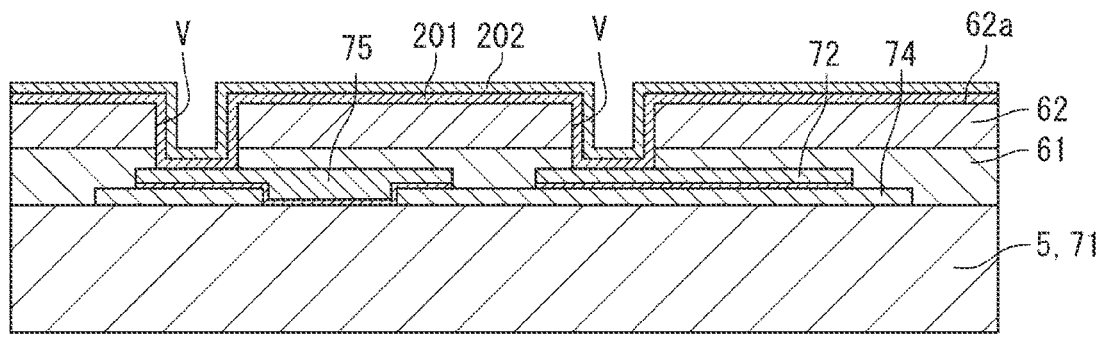
FIG. 4G is another cross-sectional view for explaining the method of manufacturing the electronic component.
Figure 4H:
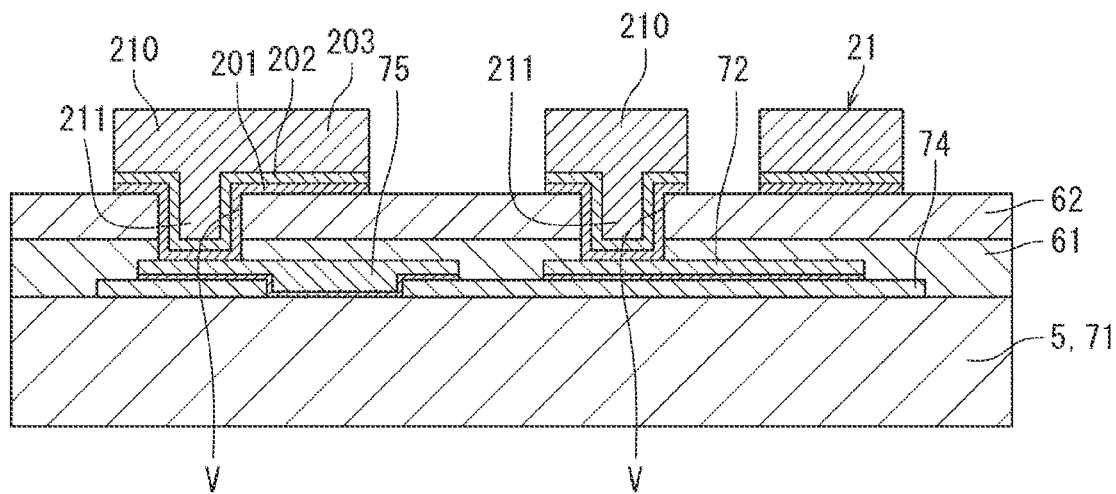
FIG. 4H is another cross-sectional view for explaining the method of manufacturing the electronic component.

As illustrated in FIG. 4G, the contact layer 201 is formed by sputtering on the first principal surface 62a of the interlayer-insulation layer 62, the inside surfaces of the via holes V, and the exposed regions of the second electrode layer 72 and the connection conductor layer 75. Subsequently, the conducting layer 202 is formed on the contact layer 201 by sputtering. After a resist layer (not illustrated) is formed on the conducting layer 202, the metal layer 203 is formed on the conducting layer 202 by electrolytic plating with the conducting layer 202 serving as the seed layer. The resist layer is removed, and the resist-covered portions of the contact layer 201 and the conducting layer 202 are also removed. Subsequently, as illustrated in FIG. 4H, the inductor wire 21 is formed on the interlayer-insulation layer 62. The inductor wire 21 includes the inductor portion 210 disposed on the first principal surface 62a of the interlayer-insulation layer 62 and also includes the via portions 211 formed through the via holes V and connected to the second electrode layer 72 and to the connection conductor layer 75, respectively.

Figure 4I:
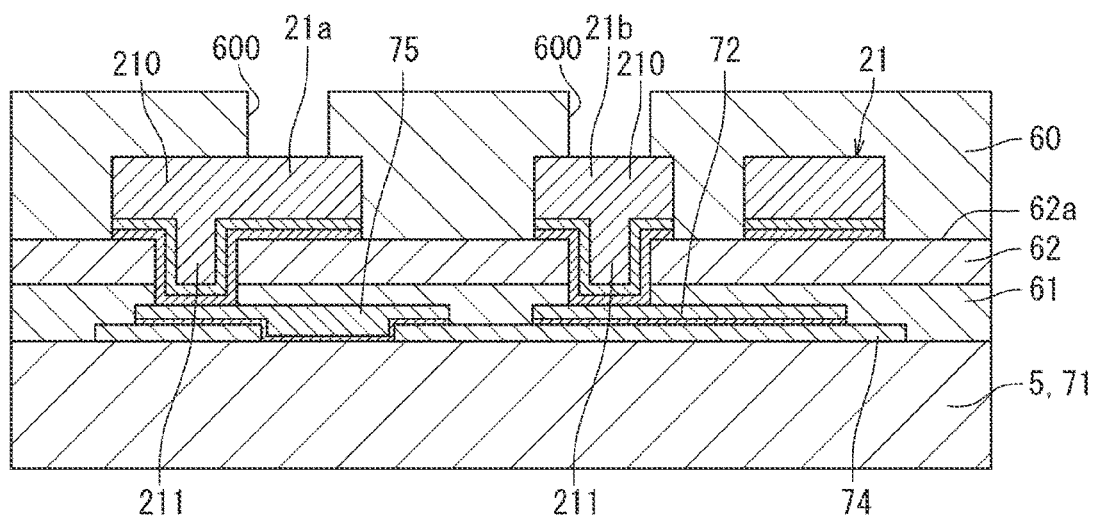
FIG. 4I is another cross-sectional view for explaining the method of manufacturing the electronic component.

As illustrated in FIG. 4I, the insulator 60 is formed on the first principal surface 62a of the interlayer-insulation layer 62 so as to cover the inductor wire 21. The via holes 600 are formed through the insulator 60 using photolithography so as to expose the first end 21a and the second end 21b of the inductor wire 21.

Figure 4J:
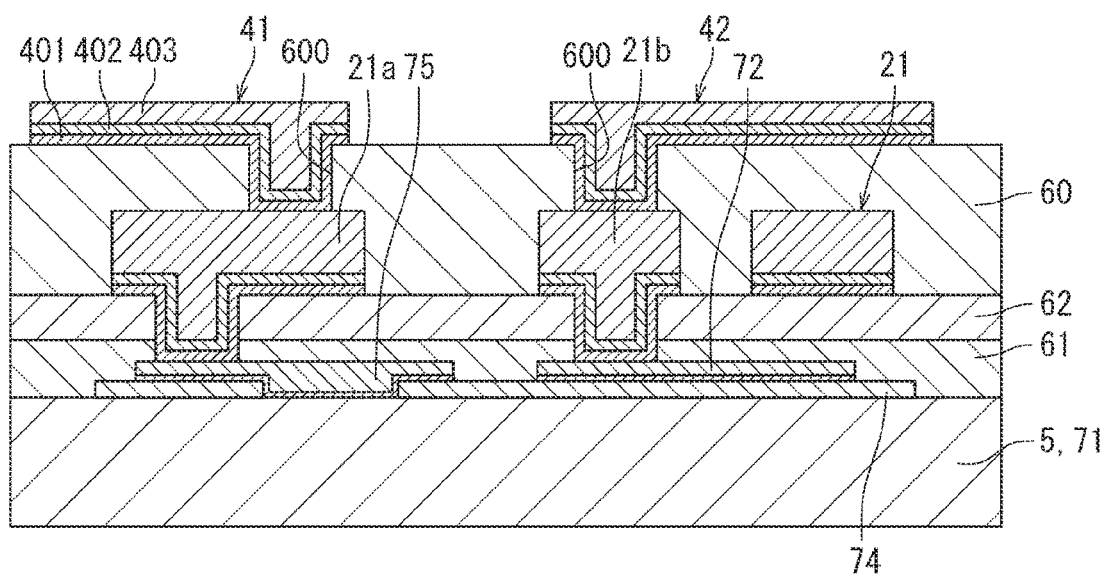
FIG. 4J is another cross-sectional view for explaining the method of manufacturing the electronic component.

As illustrated in FIG. 4J, the first outer terminal 41 and the second outer terminal 42 are formed on the upper surface of the insulator 60 and in the via holes 600. The first outer terminal 41 and the second outer terminal 42 include the contact layer 401, the conducting layer 402, and the metal layer 403, as does the inductor wire 21 (which includes the contact layer 201, the conducting layer 202, and the metal layer 203). The first outer terminal 41 is connected to the first end 21a of the inductor wire 21, and the second outer terminal 42 is connected to the second end 21b of the inductor wire 21. Thus, the electronic component 1 illustrated in FIG. 2 is produced.

Second Embodiment

Figure 5:
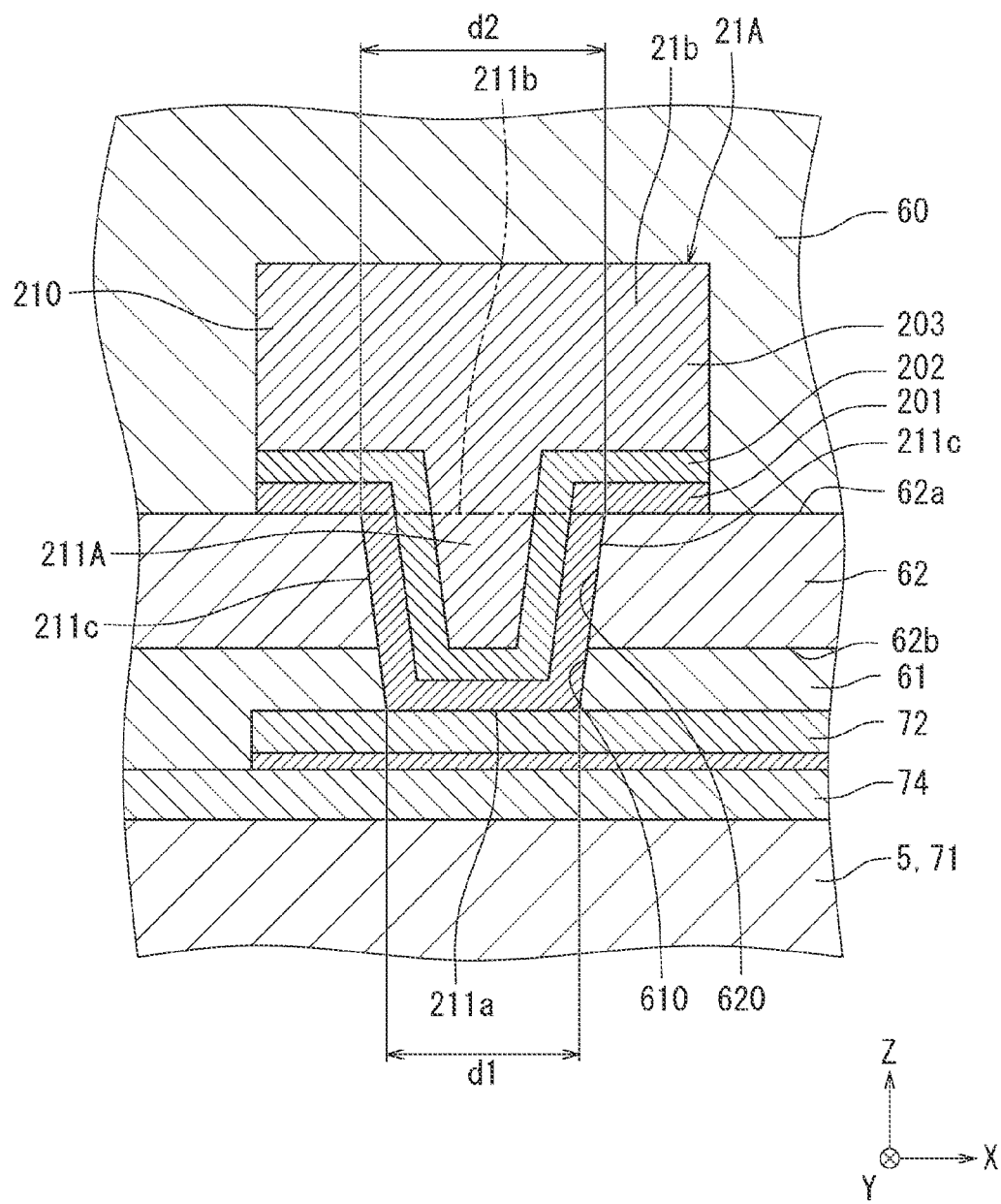
FIG. 5 is a cross-sectional view of an electronic component according to a second embodiment.

FIG. 5 is a cross-sectional view of an electronic component according to a second embodiment. FIG. 5 is a cross section taken so as to include the central axis of a via portion. The second embodiment is different from the first embodiment in that the via portions of the inductor wire is formed differently, which will be described below. Note that the other elements are the same as those of the first embodiment. These elements will be denoted by the same reference signs, and the descriptions thereof will be omitted.

As illustrated in FIG. 5, a via portion 211A of an inductor wire 21A of the second embodiment has a first contact surface 211a being in contact with the second electrode layer 72 and a second contact surface 211b being in contact with the inductor portion 210. The second contact surface 211b is positioned on the same plane on which the first principal surface 62a of the interlayer-insulation layer 62 extends. The second contact surface 211b is the interface between the inductor portion 210 and the via portion 211A. The inductor portion 210 and the via portion 211A, however, are formed integrally as described in the first embodiment, which makes it difficult to distinguish the second contact surface 211b (the interface). The second contact surface 211b can be formed such that the interface is distinguishable.

The first contact surface 211a and the second contact surface 211b are shaped circularly as viewed in the Z direction. The first contact surface 211a and the second contact surface 211b, however, can be shaped like ellipses or polygons. The first contact surface 211a has a first diameter d1, and the second contact surface 211b has a second diameter d2. The first diameter d1 is smaller than the second diameter d2. As viewed in the Z direction, the first diameter d1 of the first contact surface 211a is the circle equivalent diameter of the first contact surface 211a, and the second diameter d2 of the second contact surface 211b is the circle equivalent diameter of the second contact surface 211b.

According to the above configuration, in the cross section of the via portion 211A taken so as to include the central axis thereof, the via portion 211A can have, for example, tapered side surfaces 211c between which the width becomes smaller as the distance from the first contact surface 211a becomes smaller. This can increase the contact area between the via portion 211A and the inside surfaces of the via holes 610 and 620, which can improve the adhesion between the inductor wire 21A and the interlayer-insulation layer 62.

The inside surfaces of the via holes 610 and 620 can be formed so as to have the tapered shape as are the side surfaces 211c of the via portion 211A. In forming the contact layer 201 using vapor deposition in manufacturing the inductor wire 21A, the material of the contact layer 201 can enter the wider region in the via holes 610 and 620 and reach easily to the narrow region. Accordingly, the contact layer 201 can be formed reliably on the inside surfaces of the via holes 610 and 620, which improves the adhesion.

As illustrated in FIG. 5, in the cross section of the via portion 211A taken so as to include the central axis thereof, the via portion 211A preferably has the tapered side surfaces 211c between which the width becomes smaller as the distance from the first contact surface 211a becomes smaller. The width of the via portion 211A above is defined as the dimension of the via portion 211A in the direction orthogonal to the central axis of the via portion 211A. More specifically, the width of the via portion 211A is the dimension in the X direction in FIG. 5. In the cross section of the via portion 211A taken along the central axis thereof, the side surfaces 211c of the via portion 211A are formed as straight lines, but the side surfaces 211c can be formed as curved lines.

Accordingly, the via portion 211A has the tapered side surfaces 211c, which can increase the contact area between the via portion 211A and the inside surfaces of the via holes 610 and 620. This can improve the adhesion between the inductor wire 21A and the interlayer-insulation layer 62.

The inside surfaces of the via holes 610 and 620 are formed so as to have the tapered shape as are the side surfaces 211c of the via portion 211A. In forming the contact layer 201 using vapor deposition in manufacturing the inductor wire 21A, the material of the contact layer 201 can enter the wider region in the via holes 610 and 620 and reach easily to the narrow region. Accordingly, the contact layer 201 can be formed reliably in the inside surfaces of the via holes 610 and 620, which improves the adhesion.

The following describes a method of forming the tapered side surfaces 211c of the via portion 211A. In this method, the step of forming the via hole V (i.e., via holes 610 and 620) in the protective layer 61 and in the interlayer-insulation layer 62 as illustrated in FIG. 4F is different from that described in the manufacturing method of the first embodiment.

When the protective layer 61 and the interlayer-insulation layer 62 are exposed to light in the photolithography process as illustrated in FIG. 4F, the via holes V (via holes 610 and via holes 620) are formed so as to have tapered shapes by controlling the position of the focal point of exposure light. More specifically, in the case where the protective layer 61 and the interlayer-insulation layer 62 are of negative type, the focal point of the exposure light is shifted toward the substrate 5, whereas in the case where the protective layer 61 and the interlayer-insulation layer 62 are of positive type, the focal point of the exposure light is shifted toward the first principal surface 62a of the interlayer-insulation layer 62. Thus, the side surfaces 211c are formed so as to have a tapered shape.

The via portion 211 of the inductor wire 21 at the second end 21b has been described so far with reference to FIG. 5. The same can be applied to the via portion 211 of the inductor wire 21 at the first end 21a.

The above embodiments are not intended to limit the present disclosure. The electronic component 1 can be changed in design without departing from the gist of the present disclosure. For example, the features described in the first and second embodiments can be combined with one another in various ways.

In the above embodiments, at least one inductor wire is included in the inductor element. In other words, the inductor element can include multiple inductor wires that are stacked in the Z direction and connected in parallel or in series to each other. The inductor wire (the inductor portion) of the inductor element is not specifically limited in structure, shape, or material insofar as the inductor wire can produce a magnetic flux when an electric current flows therethrough and cause the inductor element to provide inductance. In particular, the winding shape of the inductor wire is not limited to a shape having straight lines or curved lines (spiral=two-dimensional curve) extending on the flat surface as in the above embodiments. The winding shape can be any known shape, such as a meander shape.

In the above embodiment, the electrode layers of the capacitor element are not specifically limited in structure, shape, or material insofar as the capacitor element has at least two electrode layers to which a voltage is applied and can store electric charge between the two electrode layers with the dielectric layer interposed therebetween. In particular, the shape of the electrode is not limited to the tabular shape as in the above embodiments but can be any shape, such as a meander shape.

In the above embodiments, the electronic component includes one capacitor element and one inductor element. At least one of the capacitor element and the inductor element may be provided in multiple numbers. With this configuration, the characteristics of the electronic component can be adjusted.

The present disclosure includes the following features.

<1> An electronic component includes a capacitor element, an inductor element connected electrically to the capacitor element, and an interlayer-insulation layer interposed between the capacitor element and the inductor element. The interlayer-insulation layer has a first principal surface, a second principal surface, and a via hole formed through the interlayer-insulation layer between the first principal surface and the second principal surface. The capacitor element is disposed at a side of the second principal surface of the interlayer-insulation layer and includes a first electrode layer, a second electrode layer, and a dielectric layer interposed between the first electrode layer and the second electrode layer. The inductor element is disposed at a side of the first principal surface of the interlayer-insulation layer and includes an inductor wire that has an inductor portion disposed on the first principal surface and also has a via portion formed through the via hole so as to connect the inductor portion to the second electrode layer. The inductor wire further includes a contact layer, a conducting layer laminated on the contact layer, and a metal layer laminated on the conducting layer. The contact layer is in continuous contact with the first principal surface, an inside surface of the via hole, and the second electrode layer.

<2> In the electronic component described in <1> above, the contact layer is a titanium layer, and the second electrode layer includes an aluminum layer being in contact with the contact layer.

<3> In the electronic component described in <1> or <2> above, the metal layer is a copper layer.

<4> In the electronic component described in any of <1> to <3> above, a ratio of a thickness of the metal layer of the inductor portion in a direction orthogonal to the first principal surface to a thickness of the second electrode layer in the direction orthogonal to the first principal surface is 15 or more and 70 or less (i.e., from 15 to 70).

<5> In the electronic component described in any of <1> to <4> above, the via portion has a first contact surface being in contact with the second electrode layer and a second contact surface being in contact with the inductor portion, and a first diameter d1 of the first contact surface is smaller than a second diameter d2 of the second contact surface.

<6> In the electronic component described in any of <1> to <5> above, the via portion has a first contact surface being in contact with the second electrode layer and a second contact surface being in contact with the inductor portion, and in a cross section of the via portion taken along a central axis thereof, the via portion has tapered side surfaces between which a width becomes smaller as a distance from the first contact surface becomes smaller.

What is claimed is:

1. An electronic component, comprising:
a capacitor element;
an inductor element connected electrically to the capacitor element; and
an interlayer-insulation layer between the capacitor element and the inductor element, wherein
the interlayer-insulation layer has a first principal surface, a second principal surface, and a via hole through the interlayer-insulation layer between the first principal surface and the second principal surface,
the capacitor element is at a side of the second principal surface of the interlayer-insulation layer and includes a first electrode layer, a second electrode layer, and a dielectric layer interposed between the first electrode layer and the second electrode layer,
the inductor element is at a side of the first principal surface of the interlayer-insulation layer and includes an inductor wire that has an inductor portion disposed on the first principal surface and also has a via portion through the via hole so as to connect the inductor portion to the second electrode layer,
the inductor wire further includes a contact layer, a conducting layer in contact with the contact layer, and a metal layer in contact with the conducting layer, and
the contact layer is in continuous contact with the first principal surface, an inside surface of the via hole, and the second electrode layer,
wherein the interlayer-insulation layer is made of an organic insulating material selected from the group consisting of an epoxy-based material, phenol-based material, liquid polymer-based material, polyimide-based material, acrylic-based material, and a mixture thereof,
wherein a ratio of the thickness of the metal layer to the thickness of the contact layer is 7 to 15.

2. The electronic component according to claim 1, wherein
the contact layer is a titanium layer, and
the second electrode layer includes an aluminum layer in contact with the contact layer.

3. The electronic component according to claim 2, wherein
the metal layer is a copper layer.

4. The electronic component according to claim 2, wherein
a ratio of a thickness of the metal layer of the inductor portion in a direction orthogonal to the first principal surface to a thickness of the second electrode layer in the direction orthogonal to the first principal surface is from 15 to 70.

5. The electronic component according to claim 2, wherein
the via portion has a first contact surface in contact with the second electrode layer and a second contact surface in contact with the inductor portion, and a first diameter of the first contact surface is smaller than a second diameter of the second contact surface.

6. The electronic component according to claim 2, wherein
the via portion has a first contact surface in contact with the second electrode layer and a second contact surface in contact with the inductor portion, and
in a cross section of the via portion taken along a central axis thereof, the via portion has tapered side surfaces between which a width becomes smaller as a distance from the first contact surface becomes smaller.

7. The electronic component according to claim 1, wherein
the metal layer is a copper layer.

8. The electronic component according to claim 1, wherein
a ratio of a thickness of the metal layer of the inductor portion in a direction orthogonal to the first principal surface to a thickness of the second electrode layer in the direction orthogonal to the first principal surface is from 15 to 70.

9. The electronic component according to claim 1, wherein
the via portion has a first contact surface in contact with the second electrode layer and a second contact surface in contact with the inductor portion, and
a first diameter of the first contact surface is smaller than a second diameter of the second contact surface.

10. The electronic component according to claim 1, wherein
the via portion has a first contact surface in contact with the second electrode layer and a second contact surface in contact with the inductor portion, and
in a cross section of the via portion taken along a central axis thereof, the via portion has tapered side surfaces between which a width becomes smaller as a distance from the first contact surface becomes smaller.

11. An electronic component, comprising:
a capacitor element;
an inductor element connected electrically to the capacitor element; and
an interlayer-insulation layer between the capacitor element and the inductor element, wherein
the interlayer-insulation layer has a first principal surface, a second principal surface, and a via hole through the interlayer-insulation layer between the first principal surface and the second principal surface,
the capacitor element is at a side of the second principal surface of the interlayer-insulation layer and includes a first electrode layer, a second electrode layer, and a dielectric layer interposed between the first electrode layer and the second electrode layer,
the inductor element is at a side of the first principal surface of the interlayer-insulation layer and includes an inductor wire that has an inductor portion disposed on the first principal surface and also has a via portion through the via hole so as to connect the inductor portion to the second electrode layer,
the inductor wire further includes a contact layer, a conducting layer in contact with the contact layer, and a metal layer in contact with the conducting layer, and
the contact layer is in continuous contact with the first principal surface, an inside surface of the via hole, and the second electrode layer,
wherein the interlayer-insulation layer is made of an organic insulating material selected from the group consisting of an epoxy-based material, phenol-based material, liquid polymer-based material, polyimide-based material, acrylic-based material, and a mixture thereof,
wherein the second electrode layer includes a second contact layer in contact with the dielectric layer and a second metal layer in contact with the second contact layer.

* * * * *